PACKAGING OF ELECTRICAL COMPONENTS

Filed May 13, 1966

INVENTOR.
DAVIS M. GRITTON
BY
ATTORNEY

United States Patent Office 3,383,565

Patented May 14, 1968

3,383,565

PACKAGING OF ELECTRICAL COMPONENTS

Davis M. Gritton, Cincinnati, Ohio, assignor to General Electric Company, a corporation of New York Filed May 13, 1966, Ser. No. 549,870

2 Claims. (Cl. 317—101)

ABSTRACT OF THE DISCLOSURE

The disclosure shows a packaging arrangement for circuit boards having electrical elements mounted thereon. A plurality of such circuit boards is mounted within a housing and encapsulated with an elastomeric material to a level such that the electrical elements are encapsulated and the upper ends of the circuit boards extend above the elastomeric material. The circuit boards are electrically connected to a horizontal main circuit board, and the main circuit board and the upper ends of the vertical circuit boards are encapsulated in a rigid material which is locked to the housing by indentations formed in the housing.

The present invention relates to the packaging of electrical components and more particularly to the packaging of a plurality of such components in an electrical circuit.

In the quest for miniaturization of electrical and electronic circuits, etched circuit boards have been used to support a multiplicity of electrical components in a relatively small space. Such circuit boards are comprised of insulating material with a conductive material on one side which is etched to form a network of electrically conductive paths. Electrical components are generally mounted on the opposite side by passing their leads through holes in the circuit board and soldering the leads to the etched circuit.

The etched circuits of a multiplicity of circuit boards may be electrically interconnected in such a manner that a desired electrical output will be produced in response to an electrical input. By disposing the circuit boards in close proximity in a housing, a compact electrical circuit is achieved.

One of the problems that arises with such an approach is that when the housing is subjected to vibration, the circuit boards may be displaced enough to cause electrical contact between the etched circuits and an adjacent circuit or electrical component, thus shorting out the electrical circuit. The displacement of the circuit boards may also impair the continuity of the electrical interconnection. Furthermore, the electrical components may vibrate in response to vibrations transmitted to the circuit boards. Such vibration may damage the components themselves or impair the electrical continuity of their soldered connections to the etched circuits.

In the past, these occurrences have been prevented by packaging circuit boards in fixed spaced relationship by mounting them in guides in the walls of a housing. While effective in supporting the circuit boards, these guides are expensive to manufacture and may take up a substantial space in the housing. Additionally, much time may be consumed in properly placing the circuit boards in the guides.

Accordingly, it is an object of the present invention to package in a simplified economical manner a plurality of circuit boards in a fixed, closely spaced relationship and to protect electrical components secured to the circuit boards from vibration.

The above ends are achieved, in a broad sense, by providing an electrical apparatus having a housing and a plurality of circuit boards disposed therein. Electrical components wired to each of the circuit boards are provided and the circuit boards are spaced apart from one another so as to prevent contact of the electrical components. An elastomeric material is provided for filling the housing to such a level that the electrical components are encapsulated and the upper end portions of the circuit boards extend from the elastomeric material. A rigid material overlying the elastomeric material from wall to wall of the housing and surrounding the end portions of the circuit boards is provided to thereby fix their position, whereby the circuit boards are restrained from movement and the electrical components are insulated from vibration.

Preferably, the apparatus further comprises means disposed in the housing for electrically interconnecting the electrical components, the interconnecting means being surrounded by the rigid material and thereby maintained in fixed relationship to the circuit boards.

The above and other related objects and features of the invention will be apparent from a reading of the following description of the invention taken in conjunction with the accompanying drawings.

Figure 1:
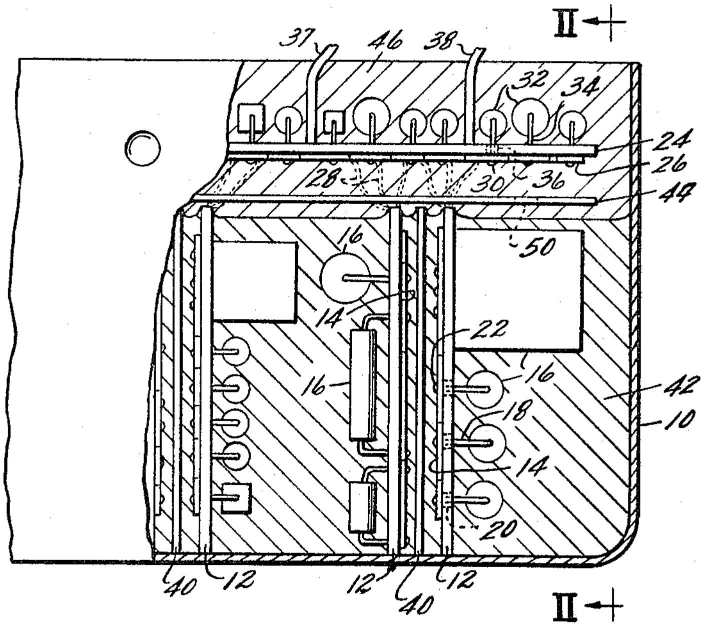
FIGURE 1 is a partial, sectional view of a housing in which an electrical circuit is packaged in accordance with the present invention.
Figure 2:
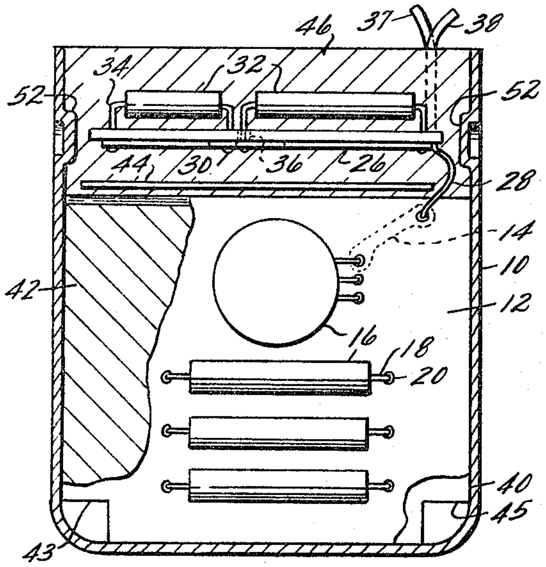
FIGURE 2 is a view taken on line II—II of FIGURE 1.

FIGURES 1 and 2 show a housing 10 for an electrical circuit comprised of a plurality of vertical circuit boards 12 of insulating material with etched circuits 14 on one side. A series of electrical components 16 are disposed on the opposite sides of the circuit boards 12 and are wired to the etched circuit 14 by means of leads 18 which extend through holes 20 and connect with the etched circuit 14 at soldered connections 22. The electrical components 16 of each vertical circuit board 14 are interconnected in such a fashion that the circuit boards 14 produce predetermined electrical outputs in response to electrical inputs.

A main circuit board 24 interconnects the etched circuits 14 by means of an etched circuit 26 on one side and a network of wires 28, soldered to the etched circuit 26 at connections 30 and leading to the etched circuits 14 of the vertical circuit boards 12. Several electrical components 32, here shown in the form of resistors, are disposed on the opposite side of the main circuit board 24 and have leads 34 which extend through holes 36 and connect with the etched circuit 26 at similar soldered connections 30. The etched circuits 14 of the vertical circuit boards 12 are interconnected in such a fashion that the electrical circuit produces a predetermined electrical output through a series of wires 37 leading from the etched circuit 26, in response to an electrical input through wires 38 leading to the etched circuit 26.

The circuit boards 12 are arranged in pairs proximate to one another and having their component sides facing away from each other. A problem with such an arrangement is that under conditions of severe vibration the vertical circuit boards 12 may come in electrical contact with one another. Furthermore, vibration of the circuit boards 12 may impair the electrical continuity of the wires 28 where they connect with the main circuit board 26.

In accordance with the present invention the main circuit board 24 and the vertical circuit board 12 are supported in such a way that their positions are fixed to prevent electrical contact of adjacent soldered connections 20 or impairment of the electrical continuity of wires 28. Furthermore, the electrical components 16 are insulated from vibration and are restrained from movement into contact with adjacent components.

The above-mentioned electrical circuit is supported by loosely placing the vertical and main circuit boards 12, 24 in the housing 10 so that the vertical circuit boards 12 are approximately parallel and their bottom edges engage the base of the housing 10. The network of wires 28 leading from the vertical circuit boards 12 is attached to the main circuit board 24 at one edge so that the main circuit board 24 can be easily tilted upward to gain access to the vertical boards 12. A series of rigid insulating sheets 40 are placed between adjacent vertical circuit boards 12 to insure against contact between their soldered connections 22. The soldered connections 22 are relatively unaffected by vibration so that contact with the insulating sheets 40 will not impair their electrical continuity.

Figure 3:
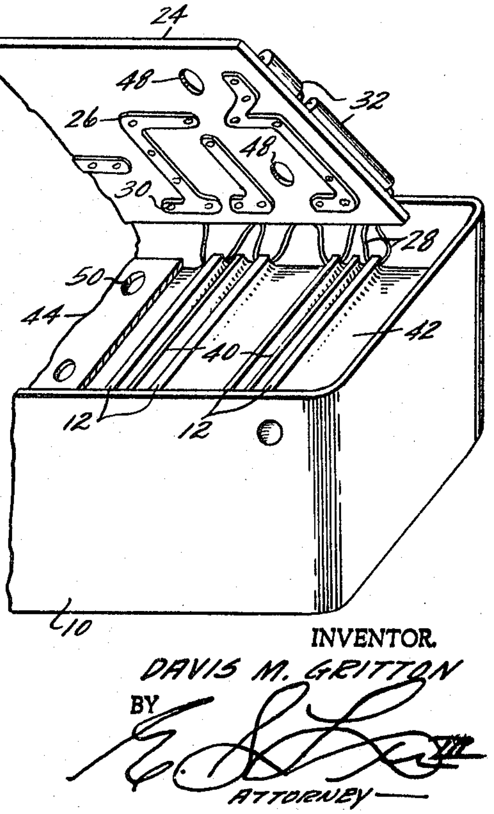
FIGURE 3 is a perspective view of the housing and electrical circuit shown in FIGURE 1.

A liquid material 42, that may be cured in place to an elastomeric state, wherein it preferably has a high dielectrical strength, is poured into the housing 10. Other desirable properties of the material are a low moisture adsorption, high thermal conductivity and an ability to remain resilient at low temperatures. Many known potting compounds may be used for this purpose, but a silicone rubber compound, GE-RTV 615, a product of the General Electric Company, has been found to be particularly convenient. The vertical circuit boards 12 and vertical insulating sheets 40 are cut away at 43 and 45 to provide an equal level of liquid between the vertical circuit boards 12 when the material 42 is poured at one end of the housing 10. A sufficient amount of the material 42 is poured into the housing 10 to encapsulate the electrical components 16. However, of more importance is the filling of housing 10 by the material 42 so that a portion of the vertical circuit boards 12 opposite the base edges extends from the elastomeric material 42, as shown in FIGURE 3.

After the material 42 is cured to an elastomeric state, a horizontal insulating sheet 44, which insures against contact of the soldered connections 30 and the etched circuit 26 with exposed electrical connections on the vertical circuit boards 12, is placed on top of the vertical circuit boards 12 and insulating sheets 40. With the main circuit board 24 placed in its horizontal position (illustrated in FIGURE 1), a sufficient amount of a liquid material 46 is poured into the housing 10 to surround the circuit board 24 and the interconnecting wires 28. Additional material 46 may be introduced to form a cover for the housing 10, as shown in FIGURE 1. The liquid material 46 is of the type that cures in place to a rigid state in which it preferably has a high dielectric strength.

It is also preferable that the material 46 in its cured state have a high thermal conductivity and a thermal coefficient of expansion that is similar to that of the housing 10. One of many potting compounds that may be suitable for this use is manufactured by the Emerson Cuming Company of Canton, Mass., referred to commercially as Stycask 2651. Holes 48, 50 in the main circuit board 24 and horizontal insulating sheet 44 allow the liquid material 46 to fill the space beneath the horizontal insulating sheet 44. A series of projections 52 are formed in the housing 10 to provide a mechanical lock for the material 46 when it has cured to a rigid state to insure locking of the vertical circuit boards 12 when the housing 10 is subjected to vibration. The input and output wires 38, 36 project from the rigid material 46 for connection with appropriate circuits.

The material 46, when cured, provides a secure integral lock for the vertical circuit boards 12 and the main circuit board 24. By locking the end portions of the vertical circuit boards 12, the rigid material 46 restrains them from movement under vibratory conditions which could cause contact between adjacent electrical components 16 or electrical connections 22. Additionally, the locking of the main circuit board 24 in relation to the vertical circuit boards 12 prevents impairment of the electrical continuity of the interconnecting wires 28 resulting from relative movement in response to vibration of the housing 10.

Generally, the electrical components 32 of the main circuit board 24 are unaffected by vibration thereby permitting material 46 to fill the entire space above the elastomeric material 42 and form a cap for the housing 10. The elastomeric material 42, while providing a surface on which the rigid material overlies, also provides a resilient support for the electrical components 16 to protect them from vibration.

The invention thus described provides a simple, compact unit in which a plurality of circuit boards can be packaged to prevent movement under vibration. The materials 42, 46 are easily poured into place in a housing containing the circuit boards and when the materials are cured, the rigid material 46 forms a rigid integral lock for the circuit boards. At the same time, the resilient elastomeric compound protects electrical components secured to the circuit boards against damage resulting from vibration.

The described invention is not limited to the support of etched circuit boards and encapsulation of their electrical components, as it may be advantageously used to support any type of circuit boards and their electrical components. Other modifications of the described embodiment will occur to those skilled in the art, and the scope of the invention is to be derived solely from the following claims.

Having thus described the invention, what is claimed as novel and desired to be secured by Letters Patent of the United States is:

1. Electrical apparatus comprising:
a housing,
a plurality of circuit boards vertically disposed therein,
a plurality of electrical components wired to each of said circuit boards on one side thereof,
said circuit boards being spaced apart from one another so as to prevent contact with said electrical components, said circuit boards further being disposed in closely adjacent pairs with the sides of each pair having electrical components thereon facing away from each other,
an elastomeric material filling the housing to such a level that said electrical components are encapsulated therein and the upper end portions of said circuit boards extend from said elastomeric material,
the lower ends of said circuit boards being supported by the floor of said housing,
a rigid material overlying the elastomeric material from wall to wall of said housing, surrounding and completely covering the upper end portions of said circuit boards thereby to fix their positions,
whereby the circuit boards are restrained from movement and said electrical components are protected from vibration,
a generally horizontally disposed main circuit board encapsulated within said rigid material,
said main circuit board having wires extending from a single side thereof to said vertical circuit boards to provide electrical interconnections therewith,
whereby encapsulation of the vertical boards in elastomeric material and encapsulation of the horizontal board in rigid material is facilitated.

2. Apparatus as in claim 1 further comprising,
a plurality of first insulating sheets disposed between closely adjacent vertical circuit boards to thereby insure against electrical contact therebetween,
a generally horizontal insulating sheet adjacent the bottom side of said horizontal circuit board to thereby insure against electrical contact between said horizontal circuit board and said vertical circuit boards,
said horizontal circuit board and horizontal insulating sheet have openings therein to thereby permit said rigid material to surround said end portions of said vertical circuit boards and to surround said horizontal circuit board and said horizontal insulating sheet.

References Cited

UNITED STATES PATENTS 3,175,127 5/1965 Knox-Seith ---------- 317—101

FOREIGN PATENTS 1,171,038 5/1964 Germany.

ROBERT K. SCHAEFER, *Primary Examiner.*

D. SMITH, Jr., *Assistant Examiner.*